United States Patent
Roessler et al.

(10) Patent No.: US 12,339,329 B2
(45) Date of Patent: Jun. 24, 2025

(54) DEVICE FOR CONTROLLING TRAPPED IONS HAVING AN ELECTRODE CIRCUITRY CONFIGURED FOR DEVICE TESTING

(71) Applicant: Infineon Technologies Austria AG, Villach (AT)

(72) Inventors: Clemens Roessler, Villach (AT); Thomas Ostermann, Velden am Wörthersee (AT); Norbert Rieser, Millstatt (AT); Johanna Elisabeth Roessler, Villach (AT); Siegfried Schmid, Hemau (DE); Walter Slamnig, Latschach (AT)

(73) Assignee: Infineon Technologies Austria AG, Villach (AT)

( * ) Notice: Subject to any disclaimer, the term of this patent is extended or adjusted under 35 U.S.C. 154(b) by 383 days.

(21) Appl. No.: 17/865,559

(22) Filed: Jul. 15, 2022

(65) Prior Publication Data
US 2023/0019665 A1    Jan. 19, 2023

(30) Foreign Application Priority Data
Jul. 15, 2021   (EP) ..................... 21185777

(51) Int. Cl.
*H01J 3/40*   (2006.01)
*G01R 27/02*  (2006.01)
*G01R 31/66*  (2020.01)

(52) U.S. Cl.
CPC ............ *G01R 31/66* (2020.01); *G01R 27/02* (2013.01); *H01J 3/40* (2013.01)

(58) Field of Classification Search
CPC .. G01R 31/66; G01R 27/02; H01J 3/40; H01J 49/42
See application file for complete search history.

(56) References Cited

U.S. PATENT DOCUMENTS

2017/0304818 A1* 10/2017 Brown .................... B01L 3/502

FOREIGN PATENT DOCUMENTS

WO    WO-2021006811 A1 *  1/2021

OTHER PUBLICATIONS

Holz, P.C., et al., "Two-dimensional linear trap array for quantum information processing", Adv. Quantum Technol., 3, 2020, pp. 1-26.
(Continued)

*Primary Examiner* — David E Smith
*Assistant Examiner* — Hsien C Tsai
(74) *Attorney, Agent, or Firm* — Murphy, Bilak & Homiller, PLLC (57) ABSTRACT

A device for controlling trapped ions includes a substrate. An electrode structure is disposed on the substrate, the electrode structure including DC electrodes and RF electrodes of an ion trap configured to trap ions in a space above the substrate. A first device terminal is disposed on the substrate, the first device terminal being connected via a first electrode connection line to a specific DC electrode. Further, a second device terminal is disposed on the substrate, the second device terminal being connected via a second electrode connection line to the specific DC electrode.

13 Claims, 4 Drawing Sheets

(56) References Cited

OTHER PUBLICATIONS

Tao, Jing, et al., "3D Integration of CMOS-compatible Surface Electrode Ion Trap and Silicon Photonics for Scalable Quantum Computing", IEEE, 69th Electronic Components and Technology Conference (ECTC), 2019, pp. 1735-1743.

Maunz, Peter, "High Optical Access Trap 2.0", Version 1, Sandia National Laboratories, Intelligence Advanced Research Projects Activity (IARPA) under the Multi Qubit Coherent Operations (MQCO), Jan. 20, 2016, pp. 1-88.

\* cited by examiner

DEVICE FOR CONTROLLING TRAPPED IONS HAVING AN ELECTRODE CIRCUITRY CONFIGURED FOR DEVICE TESTING

TECHNICAL FIELD

This disclosure relates generally to the field of trapped ions, and in particular to devices for controlling trapped ions for quantum computing and methods of manufacturing such devices.

BACKGROUND

Trapped ions are one of the most promising candidates for use as qubits (quantum bits) in quantum computers since they can be trapped with long lifetimes in a scalable array by virtue of electromagnetic fields. Presently, the most advanced ion traps can control about 50 qubits individually and can maintain up to 20 qubits in a fully entangled state. Future quantum computers will need to increase the number of controllable qubits to more than 100 or even 1000 to outperform classical supercomputers. Further, the number of ions used for each qubit will in future be raised to about 6 to 100 ions in order to allow for more efficient error-correction during quantum computing.

With increasing the number of ions, the number of electrodes for controlling the ions increases. Presently, about 100 electrodes are used to control about 10 ions. Future devices will need to have more than 10.000 electrodes for ion control and/or ion trapping. All electrodes need to be electrically connected by low resistive connection lines to terminals (e.g. wire bond pads) of the device.

Hence, when scaling-up the number of ions the complexity of the electrical interconnect between the electrodes and the terminals on the device drastically increases. The electrodes of the traps have manufacturing tolerances in the micrometer range while the device as such has macroscopic dimensions. So far, there is no viable approach available on how to effectively test all the electrode-to-terminal connections of the electrical interconnect on integrity and/or quality.

SUMMARY

According to an aspect of the disclosure, a device for controlling trapped ions includes a substrate. An electrode structure is disposed on the substrate, the electrode structure comprising DC electrodes and RF electrodes of an ion trap configured to trap ions in a space above the substrate. A first device terminal is disposed on the substrate, the first device terminal being connected via a first electrode connection line to a specific DC electrode. Further, a second device terminal is disposed on the substrate, the second device terminal being connected via a second electrode connection line to the specific DC electrode.

According to another aspect of the disclosure, a method of testing electrode circuitry of a device for controlling trapped ions is disclosed. The device for controlling trapped ions comprises at least one DC electrode of an ion trap, the at least one DC electrode being connected via a first electrode connection line to a first device terminal disposed on the substrate and via a second electrode connection line to a second device terminal disposed on the substrate. The method includes applying a test voltage across the first device terminal and the second device terminal and measuring a quantity indicative of the quality and/or integrity of the electrical connection between the first device terminal and the second device terminal.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

The words "over" or "beneath" with regard to a part, element or material layer formed or located or disposed or arranged or placed "over" or "beneath" a surface may be used herein to mean that the part, element or material layer be located (e.g. placed, formed, arranged, disposed, placed, etc.) "directly on" or "directly under", e.g. in direct contact with, the implied surface. The word "over" or "beneath" used with regard to a part, element or material layer formed or located or disposed or arranged or placed "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
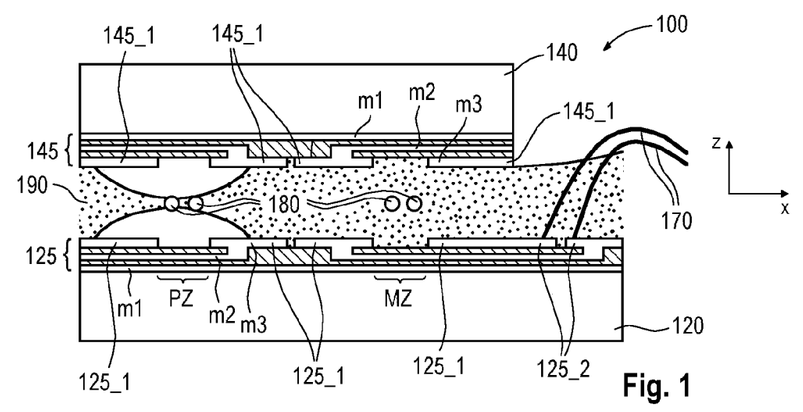
FIG. 1 is a schematic cross-sectional view in the Z-X plane of an exemplary device for controlling trapped ions, further illustrating lateral optical access by laser light into the device.

Referring to FIG. 1, a device 100 for controlling trapped ions may include a substrate 120 and, optionally, a top substrate 140. The top substrate 140 may be disposed over the substrate 120 in Z-direction. The Z-direction may represent the height dimension of the device 100.

The top substrate 140 may be spaced apart in Z-direction from the substrate 120 so as to define a space between the substrate 120 and the top substrate 140.

The substrate 120 and the top substrates 140 may be substantially planar (except for surface structures created e.g. by electrodes, oxide or passivation) and may be oriented parallel to each other. In FIG. 1, parallelism of the substrate 120 and the top substrates 120 is exemplarily depicted in the X-direction and may, e.g., also apply to the Y-direction (not shown). The X-direction and the Y-direction are perpendicular to each other and define a plane in the width and length directions of the device 100 which is normal to the Z-direction.

The substrate 120 and/or the top substrate 140 may, e.g., comprise or be of a semiconductor material, e.g. silicon or silicon carbide or silicon-on-insulator (SOI). In other examples, the substrate 120 and/or the top substrate 140 may comprise or be of a dielectric material such as, e.g., glass, fused silica or sapphire.

The distance between the substrate 120 and the (optional) top substrate 140 may be in a range between, e.g., 50 µm to 1000 µm, in particular 100 µm to 400 µm, or 200 µm to 300 µm. The substrate 120 and the top substrate 140 may, e.g., have each a thickness in a range between, e.g., 250 µm to 1500 µm, in particular 300 µm to 1000 µm, more in particular 400 µm to 750 µm or 500 µm to 600 µm.

The space above the substrate 120 (and, if the top substrate 140 is existing, between the substrate 120 and the top substrate 140) includes one or a plurality of ion traps configured to trap one or a plurality of ions 180. The location of the ions 180 can be controlled by the one or more ion traps. The ions 180 can, e.g., be moved in the space in one or more lateral directions (e.g. in the X-direction or in the Y-direction or in any direction lying in the X-Y plane.

The one or more ion traps implemented in the device 100 may have an RF Paul trap design. Paul traps may have an electrode layout that leads to RF trapping in all three dimensions (known as point traps) or may have an electrode layout which causes two-dimensional RF trapping plus static electric-field trapping in the third dimension (known as linear ion traps).

The substrate 120 is provided with an electrode structure disposed on the substrate 120, e.g. on a top side of the substrate 120. The electrode structure comprises a plurality of electrodes 125_1. The electrodes 125_1 are the electrodes of the ion trap(s) of the device 100. Further, device terminals 125_2 are disposed on the substrate 120. The device terminals 125_2 are electrically connected to respective electrodes 125_1 via electrode connection lines which are described further below in more detail.

The device terminals 125_2 may, e.g., be formed as contact pads or bond pads, wherein bond pads may, e.g., be implemented by wire bond pads or by through-substrate-vias (TSV) bond pads. The device terminals 125_2 are configured to connect the device 100 (and in particular the ion trap(s) thereof) via electrical connections 170 (e.g. wire bonds or TSV bonds) to external circuitry (not shown).

The electrodes 125_1 and the device terminals 125_2 may be structured out of a metal structure 125 provided at the substrate 120. The metal structure 125 may be a single-layer metal structure or a multi-layer metal structure. For instance, in the latter case, the electrodes 125_1 may be structured out of an uppermost metal layer m3 of the metal structure 125.

Further, the device terminals 125_2 may, e.g., be structured in the same uppermost metal layer m3 of the metal structure 125.

If the device 100 is a surface ion trap device, i.e. if the top substrate 140 is omitted, all electrodes 125_1 of the ion trap(s) of the device 100 may be formed by the electrode structure. Otherwise, if the device 100 is a three-dimensional ion trap in which the ions are trapped between the substrate 120 and the top substrate 140, an additional top electrode structure may be disposed on the top substrate 140. The top electrode structure may comprise top electrodes 145_1 which are structured out of a top metal structure 145 provided at the top substrate 140. The top metal structure 145 may be a single-layer metal structure or a multi-layer metal structure. For instance, in the latter case, the top electrodes 145_1 may be structured out of an uppermost metal layer m3 of the top metal structure 145 provided at the top substrate 140.

The top electrodes 145_1 may be disposed at a main side of the top substrate 140 opposite the main side of the substrate 120. That is, the top electrodes 145_1 may, e.g., be implemented at a bottom side of the top substrate 140.

In some examples, the metal structure 125 and/or the top metal structure 145 may be single-layer metal structures, i.e. metal structures which only consist of the metal layer m3. However, in the following, without loss of generality, the metal structure 125 is exemplified as a multi-layer metal structure 125 and/or the top metal structure 145 is exemplified as a top multi-layer metal structure 145.

More specifically, the multi-layer metal structure 125 and/or the multi-layer top metal structure 145 may each include e.g. at least three metal layers. The lowest metal layer, so-called metal 1 (m1), may be configured to electrically screen the respective substrate 120, 140 electrically. Metal 1 (m1) may be an almost or completely continuous metal layer or may be structured. In other examples, metal 1 (m1) may be a structured metal layer used for wiring the device terminals 125_2 and electrodes 125_1.

Metal 2 (m2), the metal layer above metal 1, may be a redistribution layer, i.e. may be a structured metal layer which is used for wiring, e.g. for wiring the device terminals 125_2 and electrodes 125_1. Metal 2 (m2) may be electrically insulated from metal 1 (m1) by an insulating layer arranged between metal 1 (m1) and metal 2 (m2). In other examples, metal 2 (m2) may be configured to electrically screen metal 1 (m1) from metal 3 (m3). In this case, metal 2 (m2) may be an almost or completely continuous metal layer.

Metal 3 (m3), the top metal layer, may define the arrangement of electrodes 125_1 for the one or plurality of ion traps and, e.g., the device terminals 125_2. Hence, metal 3 (m3) is typically a structured metal layer comprising RF trap electrodes and DC trap electrodes. Structured Metal 3 (m3) is electrically connected to metal 2 (m2) and/or metal 1 (m1) by vias which connect through an electrically insulating layer arranged between metal 2 (m2) and metal 3 (m3) and/or between an electrically insulating layer arranged between metal 1 (m1) and metal 2 (m2).

Further, the uppermost metal 3 (m3) may define contact pads for an electrical interconnect (not shown) between the multi-layer metal structure 125 and the multi-layer top metal structure 145. Such an electrical interconnect (not shown) may be routed through spacer elements (not shown) used to define the distance between the substrate 120 and the top substrate 140. In this case, the DC and/or RF electrodes of the multi-layer top metal structure 145 may be connected via the electrical interconnect to device terminals 125_2 disposed on the substrate 120.

The metal layers m1, m2, m3 may be manufactured during microfabrication processing. Metals such as, e.g., Cu, Al, Au, Pt, Pd, Ti, TiW, TiN etc. may be used for metal layers m1, m2, m3. The surface of metal 3 (m3) may be plated by a chemically inert and electrically conductive material such as, e.g., Au or Pt to avoid surface charge generation. The insulating layers between the metal layers m1, m2, m3 may, e.g., comprise or be of a hard passivation material such as, e.g., silicon nitride and/or silicon oxide.

Microfabrication techniques for metal layer formation and structuring may, e.g., involve photolithography methods (e.g. including photoresist application, patterning, etching) and/or deposition techniques (e.g. chemical vapor deposition (CVD), physical vapor deposition (PVD), sputtering) and/or plating techniques (e.g. electroless plating, galvanic plating). Further, microfabrication techniques for electrode formation and structuring may include etching processes for structuring photoresist layers, insulating layers and metal layers and/or semiconductor doping techniques for forming electrodes of highly doped semiconductor material (e.g. degenerate silicon electrodes) in the substrate 120 and/or the top substrate 140 (of a semiconductor material).

Various ion manipulation zones may be implemented in the space above the substrate 120 (and, e.g., below the top substrate 140). Such different ion manipulation zones may implement a number of different functionalities in terms of ion loading, ion handling and ion control.

For instance, ions 180 can be trapped in a processing zone PZ in which quantum operations between trapped ions 180 (then acting as so-called quantum bits (qubits)) may be carried out. If the ions 180 are trapped as qubits, the qubit states need to be controlled and read out. Hence, a processing zone PZ typically requires the access of laser light for laser-based state preparation of trapped ions and laser light for reading out the qubit states (or alternatively the read-out operation may be carried out in a separate readout zone). Further, fluorescence light from ions 180 in the processing zone PZ may need to be collected for state measurement.

The device 100 for controlling trapped ions may further include a memory zone MZ in which ions 180 are cooled and stored. Laser light is needed for ion cooling. FIG. 1 illustrates by way of example that the device 100 allows laser light 190 to be introduced to a center region of the device 100 in lateral directions at one, multiple or all sides of the device 100. Further, ions 180 may be moved between the memory zone MZ and the processing zone PZ.

A problem which aggravates with increasing number of ions 180 is the growing complexity of the electrical interconnect between external circuitry (not shown) and the electrodes 125_1 and, e.g., top electrodes 145_1, of the ion trap(s).

Figure 2:
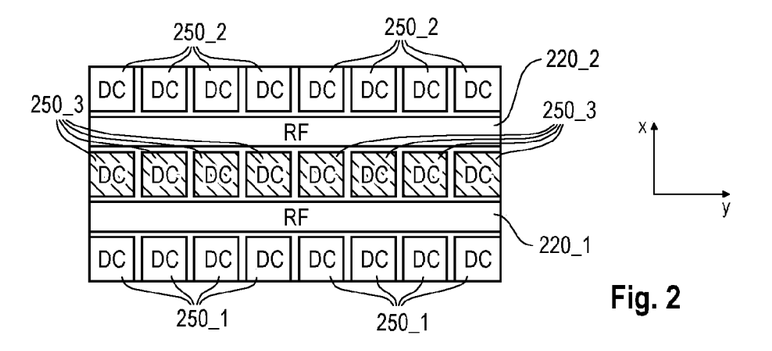
FIG. 2 is a schematic top view on the X-Y plane of an exemplary RF and DC electrode arrangement.

FIG. 2 is a top view on a possible electrode structure comprising electrodes 125_1 of an ion manipulation zone such as, e.g., the memory zone MZ. The electrodes 125_1 may, e.g., comprise a plurality of DC electrodes 250_1, 250_2, 250_3 and RF electrodes 220_1, 220_2. The DC electrodes 250_1 and 250_3 may be arranged adjacent to the RF electrode 220_1 and the DC electrodes 250_2 and 250_3 may be arranged adjacent to the RF electrode 220_2. The DC electrodes 250_1, 250_2, 250_3 may be arranged along the corresponding RF electrodes 220_1, 220_2 in a row. The DC electrodes 250_1, 250_2 may be of opposite polarity in operation. The DC electrodes 250_3 may be set to RF ground in operation. Typically, the number of DC electrodes 250_1, 250_2, 250_3 is much larger than the number of RF electrodes 220_1, 220_2. Further, the lateral dimensions of at least some of the DC electrodes 250_1, 250_2, 250_3 are much smaller than the length of the RF electrodes 220_1, 220_2. The RF electrodes 220_1, 220_2 are also referred to as RF rail electrodes in the art.

All electrodes 125_1, e.g. the RF electrodes 220_1, 220_2 and the DC electrodes 250_1, 250_2, 250_3 need to be electrically connected by low resistive connection lines to device terminals 125_2 of the device 100. This is in particular a challenge in view of the DC electrodes 250_1, 250_2, 250_3 which have small lateral sizes of about tens of micrometers, manufacturing tolerances in the micrometer range and are operated at comparable low voltages of about ±10V.

Figure 3A:
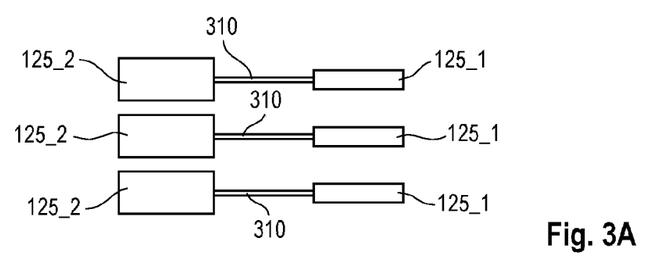
FIG. 3A is a schematic top view on a conventional interconnect between electrodes and terminals of a device.

FIG. 3A illustrates a conventional interconnect between individual electrodes 125_1 of an ion trap and individual device terminals 125_2. Each electrode 125_1 is electrically connected to the respective device terminal 125_2 by an electrode connection line 310.

After assembly, the quality and integrity of the electrode connection lines 310 need to be individually verified. In particular, the devices 100 need to be tested for shorts between every combination of device terminals 125_2 and electrodes 125_1.

Conventionally, if a single-layer metal structure is used, the device terminals 125_2, electrodes 125_1 and electrode connection lines 310 are checked by optical inspection. Further, capacitance measurements of the device terminals 125_2 and the electrodes 125_1 to ground may be carried out.

Conventional devices 100 having about 100 electrodes are tested by using a charge induced image contrast technique. This technique relies on placing the device 100 in a scanning electron microscope (SEM) and subsequently applying voltages to the electrodes 125_1 resulting in a changing contrast in the SEM.

All these methods are prone to error and/or are time-consuming and therefore ill-suited for larger devices having a high number of electrodes 125_1 and/or 145_1, in particular of DC electrodes 250_1, 250_2, 250_3. So far, there is no viable approach available on how to effectively test all the electrode-to-device terminal connections of the electrical interconnect on integrity and/or quality.

Figure 3B:
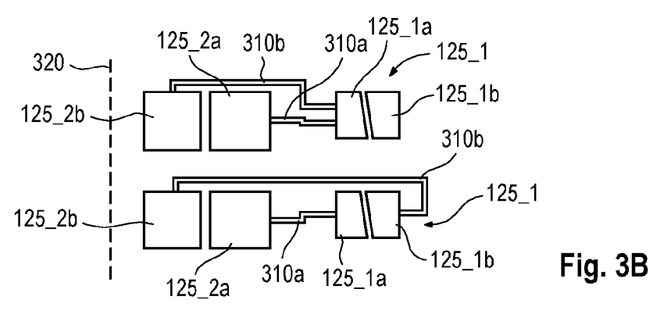
FIG. 3B is a schematic top view on two exemplary interconnects between an electrode and device terminals in accordance with two examples of the disclosure.

Referring to FIG. 3B, in accordance with the disclosure, a specific electrode 125_1 (which is here shown to have an electrical interruption) is connected via a first electrode connection line 310a to a first device terminal 125_2a and is connected via a second electrode connection line 310b to a second device terminal 125_2b. The first device terminal 125_2a and the second device terminal 125_2b are disposed on the substrate 120. The first electrode connection line 310a and the second electrode connection line 310b may be provided in the metal structure 125.

The upper portion of FIG. 3B illustrates a first option in which the first electrode connection line 310a is connected to a first end 125_1a of the electrode 125_1 and the second electrode connection line 310b is connected to the same first end 125_1a of the electrode 125_1. In this case, a failure (e.g. electrical interruption) of the electrode connection lines 310a, 310b may be detected but a failure (e.g. electrical interruption) of the electrode 125_1 may not be detectable.

The lower portion of FIG. 3B illustrates a second option in which the first electrode connection line 310a is connected to a first end 125_1a of the electrode 125_1 and the second electrode connection line 310b is connected to a second end 125_1b of the electrode 125_1, which is located on the opposite side of the electrode 125_1. In this case, a failure (e.g. electrical interruption) of the electrode connection lines 310a, 310b and a failure (e.g. electrical interruption) of the electrode 125_1 may be detectable.

If the metal structure 125 is a single-layer metal structure, the layout of the electrode and device terminal connectivity may, e.g., be as depicted in FIG. 3B. That is, in the upper portion of FIG. 3B, the first electrode connection line 310a and the second electrode connection line 310b may be spaced apart in a transversal direction and may run essentially parallel to each other. In the lower portion of FIG. 3B, the first electrode connection line 310a and the second electrode connection line 310b may be spaced apart in a transversal direction and the second electrode connection line 310b may have a U-shaped bend to return to the second device terminal 125_2b e.g. by extending along the electrode 125_1 and along the first device terminal 125_2a. In other examples, if the metal structure 125 is a multi-layer metal structure, the first electrode connection line 310a and the second electrode connection line 310b may extend through different metal layers of the multi-layer metal structure 125. In this case, the first electrode connection line 310a may, e.g., be routed beneath the second electrode connection line 310b or the first electrode connection line 310a may, e.g., be routed above the second electrode connection line 310b.

Reference sign 320 may indicate the peripheral contour of the substrate 120. The second device terminal 125_2b may be located on the substrate 120 adjacent to and in an outward direction from the first device terminal 125_2a. Differently put, the first device terminal 125_2a and the second device terminal 125_2b may be aligned with each other in a direction perpendicular to the direction of the contour 320 of the substrate 120.

Figure 3C:
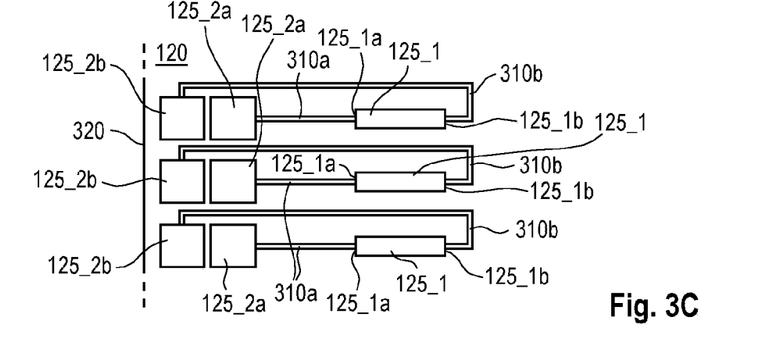
FIG. 3C is a schematic top view on an exemplary interconnect between electrodes and device terminals in accordance with an example of the disclosure.

FIG. 3C illustrates a circuit diagram of an exemplary interconnect between e.g. three electrodes 125_1 and e.g. three pairs of device terminals 125_2a, 125_2b. This circuit diagram uses the circuitry shown in the lower portion of FIG. 3B, i.e. the first electrode connection line 310a is connected to a first end 125_1a of the respective electrode 125_1 and the second electrode connection line 310b is connected to the second end 125_1b of the respective electrode 125_1, which is located on the opposite side of the electrode 125_1. In other words, a loop (or ring line) is established between each first device terminal 125_2a and second device terminal 125_2b, wherein each loop (or ring line) includes a specific electrode 125_1. If the two connections of the ring line to the electrode 125_1 are as far apart as possible, i.e. "opposite", the probability that a defect of the electrode will cut the ring line is maximized.

All electrodes 125_1 may be individually electrically connected by low resistive connection lines to device terminals 125_2a, 125_2b of the device 100. In other examples as, e.g., illustrated in FIG. 3D, one or a subset of loops or each loop (or ring line) may include a series connection SC of a plurality of specific electrodes 125_1.

It is to be noted that a plurality or all (DC and/or RF) electrodes 125_1 and, optionally, a plurality or all top (DC and/or RF) electrodes 145_1 may be connected via a respective first electrode connection line 310a to a respective first device terminal 125_2a and via a respective second electrode connection line 310b to a respective second device terminal 125_2b. In particular, the concept of providing ring lines for electrode connectivity may be applied only to the DC electrodes of the device 100 since, in many cases, the RF electrodes (see, e.g., RF rail electrodes 220_1, 220_2) are much easier to check by optical inspection and are typically much larger in size and/or smaller in number. It is also possible that the concept of providing ring lines for electrode connectivity may be applied only to a specific part of the DC electrodes, e.g. to the DC electrodes of a size smaller than a given limit and/or to the DC electrodes in a specific region of the trap, e.g. in a central region. Some of the examples disclosed herein use DC electrodes for the sake of explanation. However, in general, the entire disclosure herein of connection ion trap electrodes to device terminals applies to DC electrodes as well as to RF electrodes.

If compared to the layout of device terminals 125_2 as shown in FIG. 3A, the first and second device terminals 125_2a, 125_2b in accordance with the disclosure may be generated by separating the device terminal 125_2 (FIG. 3A) into two device terminals 125_2a, 125_2b, which then define the ends of the ring line (which further includes the first electrode connection line 310a, the electrode 125_1 and the second electrode connection line 310b). This allows to verify the integrity and/or quality of the electrical connection between any of the device terminals 125_2a, 125_2b and the electrode 125_1 by only contacting device terminals (i.e. first and second device terminals 125_2a, 125_2b). Quite in contrast, referring to the conventional circuitry layout of FIG. 3A, the electrode connection line 310 can only be tested by placing a contact needle on the electrode 125_1 which, however, involves a high risk of damaging the electrode 125_1.

Returning to FIGS. 3B-3D, in one example only one of the first device terminal 125_2a and the second device terminal 125_2b is configured as a bond pad, while the other device terminal 125_2b, 125_2a, respectively, is configured as a test pad. Configured as a bond pad means that the bond pad may be used both for testing and for bonding, while configured as a test pad means that the pad can be used as a test pad but cannot be used for bonding (e.g. because of its material, size or other properties).

Figure 3D:
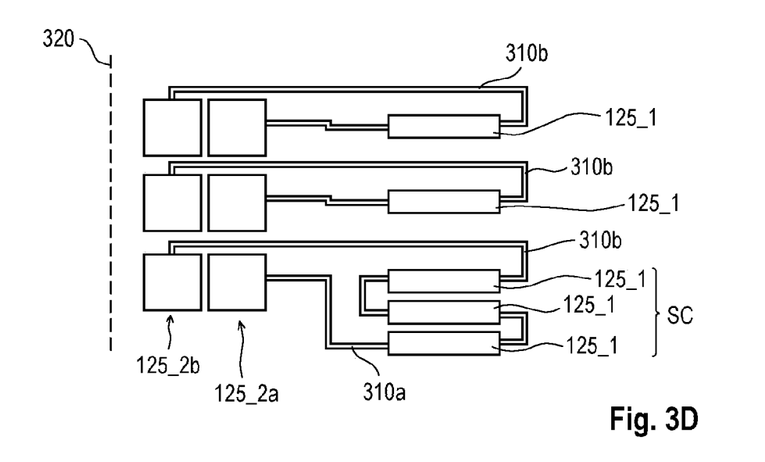
FIG. 3D is a schematic top view on an exemplary interconnect between electrodes and device terminals in accordance with an example of the disclosure.

In other examples the first device terminal 125_2a and the second device terminal 125_2b are both bond pads. This allows to use these pads first for testing the electrode circuitry and then for providing a double bond (e.g. double wire bond or double TSV bond) to connect the electrode 125_1 to an external application board such as, e.g., a PCB (printed circuit board) or an interposer (not shown). In the latter case, if the first device terminal 125_2a and the second device terminal 125_2b are both configured and used as bond pads, a low resistive and redundant connection line 310a, 310b is provided between the device terminal 125_2 (i.e. the first and second device terminals 125_2a, 125_2b) and the associated electrode 125_1. In addition, it is possible to use one of the first device terminal 125_2a and the second device terminal 125_2b as a bond pad (e.g. wire bond pad or double TSV bond pad) and the other device terminal 125_2b or 125_2a as a bridge pad connected the bond terminal by a bridge connection.

It is to be noted that the first device terminals 125_2a and the second device terminals 125_2b need not be arranged in the vicinity of the peripheral contour 320 of the substrate 120. In particular, if the first device terminals 125_2a and/or the second device terminals 125_2b are implemented by TSV bonds, the first device terminals 125_2a and/or the second device terminals 125_2b may be distributed across the substrate 120. TSV bonds are a promising approach in particular for large devices because the possible number of TSV bonds scales with the device area (i.e. substrate area) instead of only with the device perimeter. In addition, TSV bonds do not interfere with optical access, as bond wires often do.

The size of at least one of the first device terminal 125_2a and the second device terminal 125_2b may be equal to or greater than 130 μm×130 μm or 150 μm×150 μm. Such size allows to attach a bond wire to the device terminal (e.g. a wire bond pad). Differently put, if the first device terminal 125_2a and the second device terminal 125_2b each have a size equal to or greater than 130 μm×130 μm or 150 μm×150 μm, both device terminals may be used as wire bond pads. In other examples, at least one of the first device terminal 125_2a and the second device terminal 125_2b has a size equal to or greater than 130 μm×260 μm or 150 μm×300 μm. This larger size allows to place two contact needles on such device terminal, allowing the device terminal to be used for a Kelvin contact test and for the electrode circuitry contact test (and of course also as a wire bond pad if desired).

Figure 4:
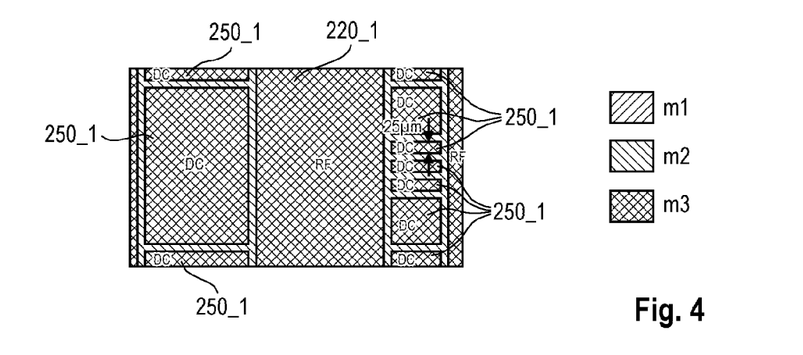
FIG. 4 is a partial top view on an exemplary electrode structure disposed on a substrate.

FIG. 4 illustrates a portion of an exemplary electrode structure disposed on the substrate 120. The electrode structure may be patterned in the uppermost metal layer m3. As shown in FIG. 4, DC electrodes may have lateral sizes as small as e.g. 25 μm. The layout illustrated in FIG. 4 is drawn to scale, and dimensions shown in FIG. 4 are disclosed as exemplary dimensions and/or as exemplary upper and/or exemplary lower limits of ranges of the illustrated dimensions. It is apparent that the DC electrodes may have rather different sizes.

Figure 5A:
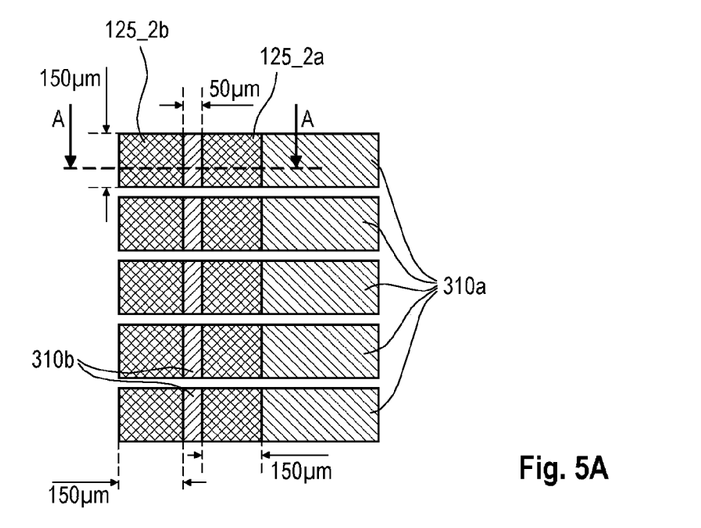
FIG. 5A is a partial top view on exemplary device terminals disposed on a substrate.
Figure 5B:
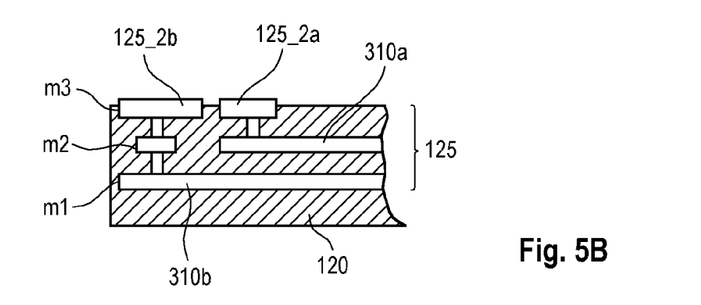
FIG. 5B is a schematic cross-sectional view along line A-A of FIG. 5A.

Referring to FIG. 5A, a partial top view on exemplary device terminals 125_2a, 125_2b is shown. The illustration is drawn to scale and dimensions shown in FIG. 5A are disclosed as exemplary dimensions and/or as exemplary upper and/or exemplary lower limits of ranges of the illustrated dimensions. FIG. 5B is a schematic cross-sectional view along line A-A of FIG. 5A. A multi-layer metal structure 125 is used, where the metal layers m1, m2 and m3 are illustrated by different hatchings. As apparent from FIG. 5A, the dimension of each of the first and second device terminals 125_2a, 125_2b are, e.g., 150 μm×150 μm. The first electrode connection line 310a may, e.g., form part of a first layer (e.g. m2) of the multi-layer metal interconnect 125 and the second electrode connection line 310b may, e.g., form part of a second layer (e.g. m1) of the multi-layer metal structure 125.

In some examples the electrode connection lines of RF electrodes 220_1 need to intersect electrode connection lines of DC electrodes 250_1, see e.g. the partial electrode layout of FIG. 4. In order to minimize crosstalk between RF and DC electrode connection lines, a metal layer may be used as a shielding layer. For instance, as illustrated in FIG. 5D, the electrode connection lines to inner DC electrodes are provided in one layer of the multi-layer metal interconnect (e.g. in metal layer m1) and another metal layer (e.g. metal layer m2) of the multi-layer metal structure 125 may be used as a shielding layer (see FIG. 5C).

Figure 5C:
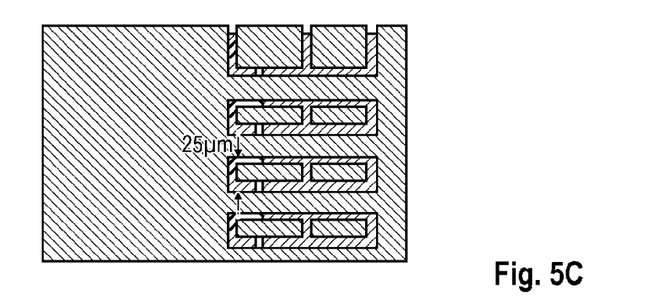
FIG. 5C is a partial top view on a layer of metal 2 (m2) illustrating an area where a small inner DC electrode of FIG. 4 is located.
Figure 5D:
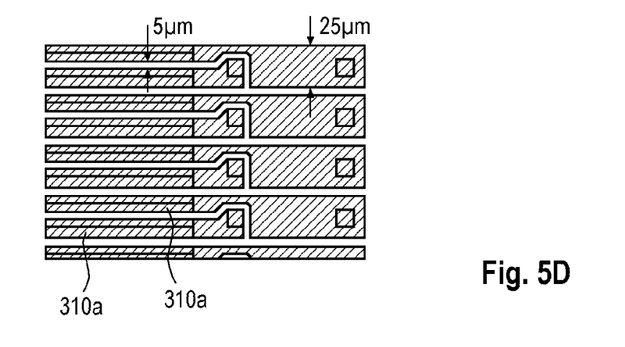
FIG. 5D is a partial top view on a layer of metal 1 (m1) within the area of FIG. 5C.

FIGS. 5C and 5D are drawn to scale and illustrate structured metal layer m1 (FIG. 5D) and structured metal layer m2 (FIG. 5C). Many other layouts of a multi-layer metal structure 125 are feasible, and FIGS. 5C and 5D merely illustrate one specific example for metal layer structuring in accordance with the disclosure. Dimensions shown in FIGS. 5C and 5D are disclosed as exemplary dimensions and/or as exemplary upper and/or exemplary lower limits of ranges of the illustrated dimensions.

Referring to FIG. 5D, a spacing between a first electrode connection line 310a and a second electrode connection line 310b may, e.g., be about 5 μm. Hence, compared to a single electrode connection line 310, the width of each of the first and second electrode connection lines 310a, 310b is less than half of, e.g. 25 μm (which is the lateral size of a DC electrode 250_1 of minimum size as depicted in FIG. 4). The smaller width of each of the first and second electrode connection lines 310a, 310b does not substantially affect the frequency limit of the DC electrode 250_1 (which may, e.g., be >1 GHz, while only 100 kHz is necessary). Crosstalk between the RF electrodes 220_1 and the DC electrodes 250_1 is effectively mitigated by the metal shielding layer (e.g. metal layer m2, see FIG. 5C). The capacitive coupling between RF electrodes 220_1 and the DC electrodes 250_1 may be less than 1 fF.

Figure 6:
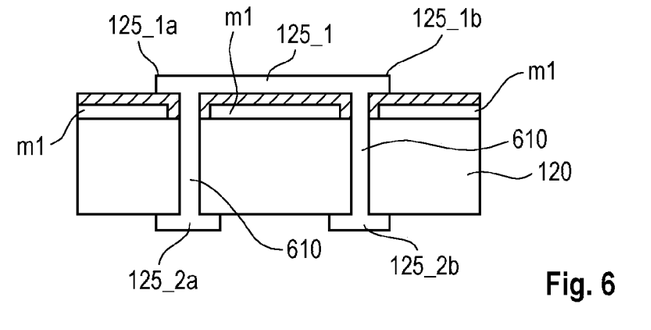
FIG. 6 illustrates device terminals implemented by through-substrate-vias (TSV).

FIG. 6 illustrates an example in which the first and second device terminals 125_2a, 125_2b are implemented by TSVs 610. The first and second device terminals 125_2a, 125_2b may then be arranged at a bottom surface of the substrate 120. The TSVs 610 may correspond to the first electrode connection line 310a and to the second electrode connection line 310b. The TSVs 610 may be formed by straight holes running through the substrate 120. The TSVs 610 may further run e.g. through layers of the metal structure 125 (see FIG. 1), e.g. through metal layer m1 and through one or more electrically insulating layers as describe above.

If the TSVs 610 are formed by straight holes, the TSVs 610 and the first and second device terminals 125_2a, 125_2b may, e.g., be aligned with the first end 125_1a of the electrode 125_1 and the second end 125_1b of the electrode 125_1, respectively. In other examples, one or more metal layers of the metal structure 125 may be used as a redistribution structure to reposition the first and second device terminals 125_2a, 125_2b. Again, both device terminals 125_2a, 125_2b may be designed as bond pads. Alternatively, as mentioned above, only one of the first device terminal 125_2a and the second device terminal 125_2b may be configured as a bond pad, while the other device terminal 125_2b, 125_2a, respectively, is configured as a test pad. In view of other features of the first and second device terminals 125_2a, 125_2b, reference is made to the above disclosure to avoid reiteration.

The ring line electrode connectivity as disclosed herein allows testing the electrode circuitry of a device 100 for controlling trapped ions on wafer level. An exemplary method of testing the electrode circuitry of such device 100 is described with reference to FIG. 7. The method is applied to a device 100 for controlling trapped ions which comprises at least one DC electrode of an ion trap, wherein the at least one DC electrode is connected via a first electrode connection line to a first device terminal disposed on the substrate and via a second electrode connection line to a second device terminal disposed on the substrate.

Figure 7:
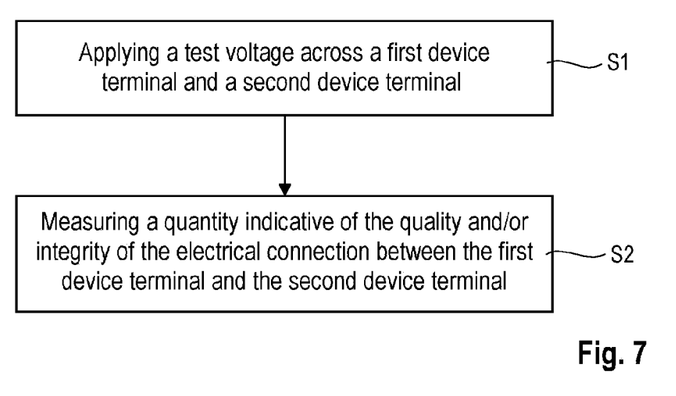
FIG. 7 is a flowchart illustrating stages of a method of testing electrode circuitry of a device for controlling trapped ions.

At S1, a test voltage is applied across the first device terminal and the second device terminal. The test voltage may, e.g., be about ±1V. The test voltage may be applied by pressing a first contact needle on the first device terminal 125_2a and by pressing a second contact needle on the second device terminal 125_2b. As mentioned before, the first device terminal 125_2a may be a wire bond pad or a test pad and/or the second device terminal 125_2b may be a wire bond pad and/or a test pad (wherein at least one wire bond pad is usually needed for making electrical contact to external circuitry).

Then, the test voltage may be applied via the first and the second contact needles across the first device terminal 125_2a and the second device terminal 125_2b.

At S2, the quantity which is measured may be indicative of the electrical resistance. For instance, if a given test voltage is applied to the first and second device terminals 125_2a, 125_2b, the current flowing through the electrode 125_1 may be measured.

If the measured quantity is outside a predefined range of values (e.g. outside a resistance or current range), the device 100 for controlling trapped ions fails the test. In this case the device 100 is usually considered as a scrap part. In other words, the possible redundancy available by the ring line circuitry to the electrodes 125_1 is usually not exploited for reducing the number of rejects.

The method of testing the electrode circuitry may further comprise testing the electrical contact between the first contact needle and the first device terminal 125_2a and/or testing the electrical contact between the second contact needle and the second device terminal 125_2b. This needle contact test at the first device terminal 125_2a may be carried out by pressing an auxiliary first contact needle on the first device terminal 125_2a and applying a contact test voltage across the first contact needle and the auxiliary first contact needle. Then, a quantity indicative of the quality and/or the integrity of the electrical contact between the first contact needle and the auxiliary first contact needle, which are electrically connected via the first device terminal 125_2a, is measured. This electrical contact measurement is also known as a Kelvin test in the art. It allows to distinguish between failed tests due to a faulty electrode circuitry and failed tests due to contact problems between the contact needle and the device terminal on which it is pressed.

Analogously, as described above for testing the electrical contact between the first contact needle and the first device terminal 125_2a, a Kelvin test as described above may be performed to test the electrical contact between the second contact needle and the second device terminal 125_2b.

If a Kelvin test is applied to both device terminals 125_2a, 125_2b of the ring electrode connection, the first device terminal 125_2a and the second device terminal 125_2b should have a size of equal to or greater than 130 μm×260 μm or 150 μm×300 μm. The first and second device terminals 125_2a, 125_2b may then still be aligned with each other as described above with respect to FIGS. 3B-3D and FIG. 5A.

By carrying out additional Kelvin tests to one or more of the first and second device terminals 125_2a, 125_2b, it is possible to avoid erroneous scrap parts which are in reality faultless products but failed the electrode circuitry testing for needle-to-device terminal contact issues.

The following examples pertain to further aspects of the disclosure:

Example 1 is a device for controlling trapped ions. The device includes a substrate; an electrode structure disposed on the substrate, the electrode structure comprising DC electrodes and RF electrodes of an ion trap configured to trap ions in a space above the substrate; a first device terminal disposed on the substrate, the first device terminal being connected via a first electrode connection line to a specific DC or RF electrode; and a second device terminal disposed on the substrate, the second device terminal being connected via a second electrode connection line to the specific DC or RF electrode.

In Example 2, the subject matter of Example 1 can optionally include wherein the first electrode connection line is connected to a first end of the specific DC or RF electrode and the second electrode connection line is connected to a second end on the opposite side of the specific DC or RF electrode.

In Example 3, the subject matter of Example 1 can optionally include wherein the first electrode connection line is connected to a first end of the specific DC or RF electrode and the second electrode connection line is connected to the same first end of the specific DC or RF electrode.

In Example 4, the subject matter of any preceding Example can optionally include wherein a plurality or all DC and/or RF electrodes of the ion trap are connected via a respective first electrode connection line to a respective first device terminal and via a respective second electrode connection line to a respective second device terminal.

In Example 5, the subject matter of any preceding Example can optionally include wherein the second device terminal is located on the substrate adjacent to and in an outward direction from the first device terminal.

In Example 6, the subject matter of any preceding Example can optionally include wherein the first device terminal and/or the second device terminal is a wire bond pad or a through-substrate-vias bond pad.

In Example 7, the subject matter of any preceding Example can optionally include wherein the size of at least one of the first device terminal and the second device terminal is equal to or greater than 130 μm×130 μm or 130 μm×260 μm.

In Example 8, the subject matter of any preceding Example can optionally include a multi-layer metal interconnect formed in the substrate and electrically connected to the electrode structure, wherein the first electrode connection line forms part of a first layer of the multi-layer metal interconnect and the second electrode connection line forms part of a second layer of the multi-layer metal interconnect.

Example 9 is a method of testing electrode circuitry of a device for controlling trapped ions, wherein the device for controlling trapped ions comprises at least one DC or RF electrode of an ion trap, the at least one DC or RF electrode being connected via a first electrode connection line to a first device terminal disposed on the substrate and via a second electrode connection line to a second device terminal disposed on the substrate, the method comprising: applying a test voltage across the first device terminal and the second device terminal; and measuring a quantity indicative of the quality and/or integrity of the electrical connection between the first device terminal and the second device terminal.

In Example 10, the subject matter of Example 9 can optionally include wherein the quantity is indicative of the electrical resistance.

In Example 11, the subject matter of Example 9 or 10 can optionally include determining that the device for controlling trapped ions failed the test if the quantity is outside a predefined range of values.

In Example 12, the subject matter of any of Examples 9 to 11 can optionally include wherein at least one of the first device terminal and the second device terminal is a bond pad, the method further comprising: pressing a first contact needle on the first device terminal; pressing a second contact needle on the second device terminal; and applying the test voltage across the first device terminal and the second device terminal via the first and second contact needles.

In Example 13, the subject matter of Example 12 can optionally include testing the electrical contact between the first contact needle and the first device terminal and/or the second contact needle and the second device terminal.

In Example 14, the subject matter of Example 13 can optionally include wherein testing the electrical contact between the first contact needle and the first device terminal further includes pressing an auxiliary first contact needle on the first device terminal; applying a contact test voltage across the first contact needle and the auxiliary first contact needle; and measuring a quantity indicative of the quality and/or integrity of the electrical contact between the first contact needle and the auxiliary first contact needle which are electrically connected via the first device terminal.

In Example 15, the subject matter of Example 13 or 14 can optionally include wherein testing the electrical contact between the second contact needle and the second device terminal further includes pressing an auxiliary second contact needle on the second device terminal; applying a contact test voltage across the second contact needle and the auxiliary second contact needle; and measuring a quantity indicative of the quality and/or integrity of the electrical contact between the second contact needle and the auxiliary second contact needle which are electrically connected via the second device terminal.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device for controlling trapped ions, the device comprising:
   a substrate;
   an electrode structure disposed on the substrate, the electrode structure comprising DC electrodes and RF electrodes of an ion trap configured to trap ions in a space above the substrate;
   a first device terminal disposed on the substrate, the first device terminal being connected via a first electrode connection line to a specific DC electrode; and
   a second device terminal disposed on the substrate, the second device terminal being connected via a second electrode connection line to the specific DC electrode.

2. The device of claim 1, wherein the first electrode connection line is connected to a first end of the specific DC electrode and the second electrode connection line is connected to a second end on the opposite side of the specific DC electrode.

3. The device of claim 1, wherein the first electrode connection line is connected to a first end of the specific DC electrode and the second electrode connection line is connected to the same first end of the specific DC electrode.

4. The device of claim 1, wherein some or all of the DC electrodes of the ion trap are connected via a respective first electrode connection line to a respective first device terminal and via a respective second electrode connection line to a respective second device terminal.

5. The device of claim 1, wherein the second device terminal is located on the substrate adjacent to and in an outward direction from the first device terminal.

6. The device of claim 1, wherein the first device terminal and/or the second device terminal is a wire bond pad or a through-substrate-vias bond pad.

7. The device of claim 1, wherein a size of at least one of the first device terminal and the second device terminal is equal to or greater than 130 µm×130 µm.

8. The device of claim 1, further comprising:
   a multi-layer metal interconnect formed in the substrate and electrically connected to the electrode structure,
   wherein the first electrode connection line forms part of a first layer of the multi-layer metal interconnect and the second electrode connection line forms part of a second layer of the multi-layer metal interconnect.

9. The device of claim 1, wherein the electrode structure is disposed on a first side of the substrate, and wherein the first device terminal and the second device terminal are disposed on a second side of the substrate opposite the first side.

10. The device of claim 9, wherein the first device terminal and the second device terminal are implemented by through-substrate-vias.

11. The device of claim 10, wherein the through-substrate-vias are formed by straight holes running through the substrate.

12. The device of claim 11, wherein the through-substrate-via that implements the first terminal is aligned with a first end of the specific DC electrode, and wherein the through-substrate-via that implements the second terminal is aligned with a second end of the specific DC electrode.

13. The device of claim 10, wherein a first one of the through-substrate-vias corresponds to the first electrode connection line and a second one of the through-substrate-vias corresponds to the second electrode connection line.

* * * * *